United States Patent
Chen et al.

[11] Patent Number: 5,700,740
[45] Date of Patent: Dec. 23, 1997

[54] PREVENTION OF CORROSION OF ALUMINUM INTERCONNECTS BY REMOVING CORROSION-INDUCING SPECIES

[75] Inventors: Chien-Feng Chen, Taichung; Huan Wen Wang, Chung-li, both of Taiwan

[73] Assignee: Taiwan Semiconductor Manufacturing Company Ltd, Hsin-Chu, Taiwan

[21] Appl. No.: 620,731

[22] Filed: Mar. 25, 1996

[51] Int. Cl.$^6$ .................................................. H01L 21/00
[52] U.S. Cl. .................... 438/710; 438/720; 438/742; 438/688; 216/67; 216/77
[58] Field of Search ................. 156/643.1, 656.1, 156/659.11, 657.1; 216/41, 67, 77, 102; 437/187, 194, 197, 235, 245

[56] References Cited

U.S. PATENT DOCUMENTS

| | | | |
|---|---|---|---|
| 5,200,031 | 4/1993 | Latchford et al. | 156/659.1 |
| 5,221,424 | 6/1993 | Rhoades | 216/77 X |
| 5,248,384 | 9/1993 | Lin et al. | 156/643 |
| 5,298,112 | 3/1994 | Hayasaka et al. | 156/643 |
| 5,380,397 | 1/1995 | Fukuyama et al. | 156/643 |
| 5,411,631 | 5/1995 | Hori et al. | 216/72 |

*Primary Examiner*—William Powell
*Attorney, Agent, or Firm*—George O. Saile; Stephen B. Ackerman

[57] ABSTRACT

A method is described for the prevention of the corrosion of interconnection wirings made of aluminum or aluminum-copper alloys in semiconductor integrated circuits. The invention uses a weak solution of $NH_4OH$ to remove chlorine-containing residues that adhere to the sidewalls of the metal wirings patterned by reactive ion etching using chlorine-containing gaseous components, thus effectively quenching the chain reaction of aluminum electrochemical corrosion involving these chlorine-containing residues as an intermediary.

23 Claims, 4 Drawing Sheets

PREVENTION OF CORROSION OF ALUMINUM INTERCONNECTS BY REMOVING CORROSION-INDUCING SPECIES

BACKGROUND OF THE INVENTION

1. Field of the Invention

This invention relates to a method of enhancing the reliability of interconnection metal lines in integrated circuits. More particularly, this invention relates to the prevention of corrosion of aluminum-based wiring in semiconductor devices and integrated circuits.

Interconnection lines, which frequently comprise aluminum or copper-aluminum alloys of various compositions, are usually formed in integrated circuits by reactive ion etching (RIE) that employs chlorine or chlorine containing gaseous compounds as the main etching agent. The etching relies on the formation of volatile aluminum chlorine compound, $AlCl_3$. However, there are often some residues of such chlorine-containing compounds that remain on the sidewalls of aluminum lines after RIE and the photoresist stripping. These chlorine-containing residues gradually corrode the aluminum lines, causing voids and, ultimately broken lines. This invention relates to a method for the removal of the chlorine-containing residue with the prevention of the corrosion of the aluminum lines as an objective.

2. Description of the Related Art

Metal interconnection lines form an essential part of an integrated circuit, serving to transmit electrical signals (voltage) and currents among various elements of an integrated circuit. Interconnection lines are usually made of metals of high electric conductivity, with aluminum being the most prevalently used on a cost/performance basis. Frequently, a small percentage of copper is added to the aluminum, forming an alloy which is more resistant to electromigration which would lead to void formation. However, aluminum is a very active metal, and is quite susceptible to corrosion. The interconnection lines are usually made in the following process: A layer of aluminum-copper alloy is deposited over a dielectric layer, such as silicon dioxide or a composition layer of silicon nitride and silicon dioxide, with the dielectric layer containing various openings for contacts between the metal lines and the silicon, or another semiconductor, substrate in an integrated circuit. The aluminum needs not contact the single crystalline semiconductor substrate directly; it may, for example, make contacts with the substrate through a highly doped and highly conductive polycrystalline silicon, and maybe additionally through another highly conductive layer such as titanium nitride which serves as a metal diffusion barrier. A continuous, blanket aluminum film is deposited by a chemical vapor deposition process, a physical evaporation process, or a physical sputtering process. A photoresist film is then coated on the aluminum film. The photoresist is then exposed to light through an appropriately patterned mask, and is then developed to form pattern of openings. The aluminum underneath these openings are then removed by reactive ion etching, which is preferred over wet etching for attaining best definition and vertical sidewalls. The reactive ion etching uses gaseous chemicals that typically contain, among others, chlorine and its various compounds such as $Cl_2$ and $BCl_3$. After reactive ion etching, these and other chlorine-containing compounds become residue sticking to the sidewall of the aluminum lines, and are very difficult to remove by, for example, rinsing in deionized water. Unremoved from the aluminum lines, these compounds can gradually cause corrosion of the aluminum lines.

Latchford et al. (U.S. Pat. No. 5,200,031) described a method to remove the chlorine-containing residue at the same time of carrying out the removal of photoresist in an oxygen-containing plasma, known as the ashing process, by flowing $NH_3$ through the plasma generator for a period of time. (However, the reaction product, $NH_4Cl$ has a boiling point of 520 degrees centigrade, and is hence more difficult to evaporate than $AlCl_3$, and will tend to stick to the aluminum lines. Through its electrolytic action after absorbing moisture from the air, corrosion of aluminum will continue).

The patent of Lin et al. (U.S. Pat. No. 5,248,384) deals with the formation of voids, not necessarily a result of corrosion by chlorine containing residue, by means of performing a rapid thermal annealing after photoresist stripping. However, this addresses only the problem of corrosion which arises from electrochemical reaction between two phases of the aluminum-copper alloys, and not that which arises as a result of chlorine-containing residues.

The patent of Hayasaka et al. (U.S. Pat. No. 5,298,112) aims to remove surface layer, with residues there on, by physical sputtering following the reactive ion etching of the aluminum and the stripping of photoresist. But the sputtering would still leave residue unremoved from the sidewalls of the aluminum lines, as the physical sputtering process is very anisotropic.

The patent of Fukuyama et al. (U.S. Pat. No. 5,380,397) aims to remove the chlorine- or bromine-containing residues by using a gas in a plasma having a hydrogen component to convert the residues into HCl or HBr.

Yet another invention (Hori et al., U. S. Pat. No. 5,411,631) relates to the use of physical sputtering for the removal of sidewall protrusions that serve as cores for the formation of RIE residues.

SUMMARY OF THE INVENTION

The object of the invention is to enhance the reliability of aluminum interconnects by preventing their corrosion caused by chlorine-containing residues left from reactive ion etching.

In aluminum corrosion, aluminum atoms lose electrons to become ions. Corrosion of aluminum with these residues can be described by the following reaction:

$$Al+Cl_2+BCl_3=AlCl_3+ \text{side product} \quad (1)$$

$$AlCl_3+H_2O=HCl+Al_2O_3 \quad (2)$$

$$HCl+Al \text{ (metal line)}=AlCl_3+H_2 \quad (3)$$

In Step 1, the reaction between aluminum and chlorine is assisted by $BCl_3$. In Step 2, aluminum absorbs moisture in the air and form $Al_2O_3$ and HCl. The transformation of Al into $Al_2O_3$ is the corrosion process, and metallic aluminum is lost to the corrosion product aluminum oxide, which is not conductive. HCl generated in Step 2 then reacts with metallic aluminum, as indicated in Step 3, producing $AlCl_3$. In this reaction, it is the positive hydrogen ion, or proton, in the HCl that captures an electron from the aluminum atom which becomes an aluminum ion. The $AlCl_3$ formed in Step 3 again absorbs moisture from the air, repeating the reaction in Step 2. Thus, Step 2 and Step 3 are repeated over and over again in chain reactions, resulting in the corrosion of aluminum lines, and eventually can cause the opening of the aluminum lines.

To prevent corrosion resulting from chain reactions described in Reactions 2 and 3, some way must be found to either quench $AlCl_3$ in Step 2 or HCl in Step 3, thereby breaking the chain reactions. HCl is an acid. The way to quench an acid is to neutralize it. $AlCl_3$ is a Lewis acid, and the way to quench it is the same as the way to quench HCl.

According to this invention, a basic solution of weak $NH_4OH$ aqua solution is used to quench HCl. This weak basic solution contains OH ions which react with $AlCl_3$ to form $Al_2O_3$ or $Al(OH)_{3-x}Cl_x$, where $x=0$ to 2, and chloride ion Cl. HCl reacts with OH– to form $H_2O$ and chloride ion Cl. After RIE patterning of the aluminum lines and the stripping of the photoresist, the wafer is immediately dipped in the $NH_4OH$ solution, and immediately following by rinsing in deionized water.

DESCRIPTION OF THE PREFERRED EMBODIMENT

Figure 1A:
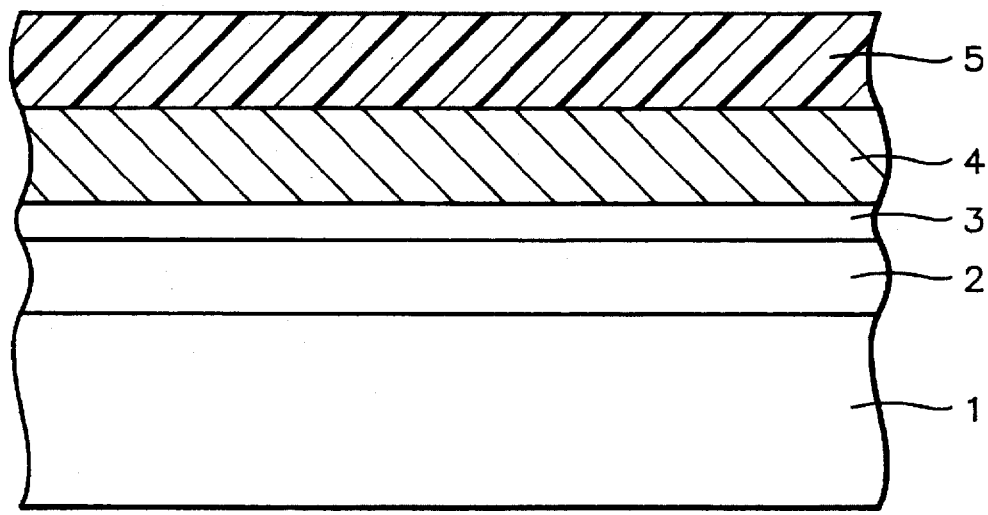
FIG. 1a–1d schematically shows an example of a simple structure of an element of a device in an integrated circuit which has been processed to form metal lines.
Figure 1B:
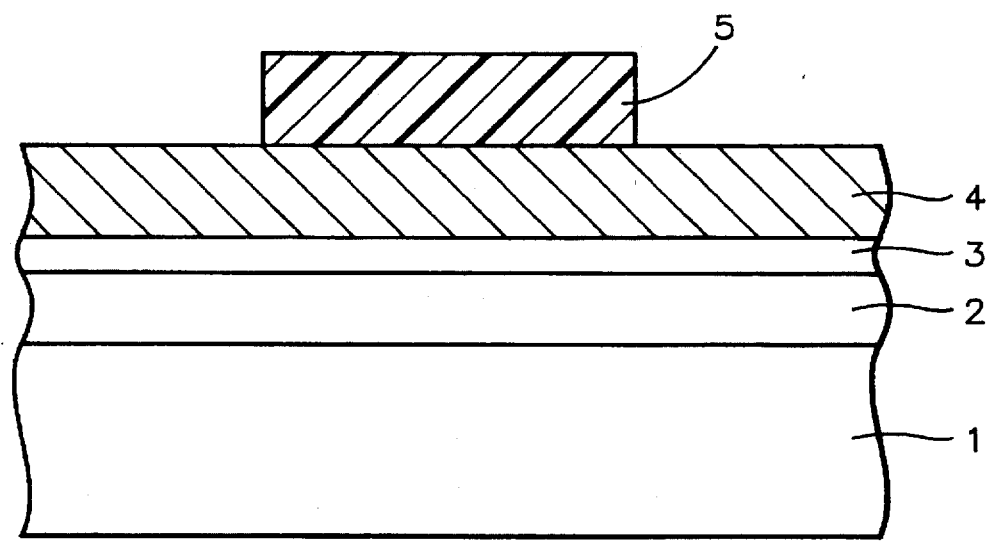
Figure 1C:
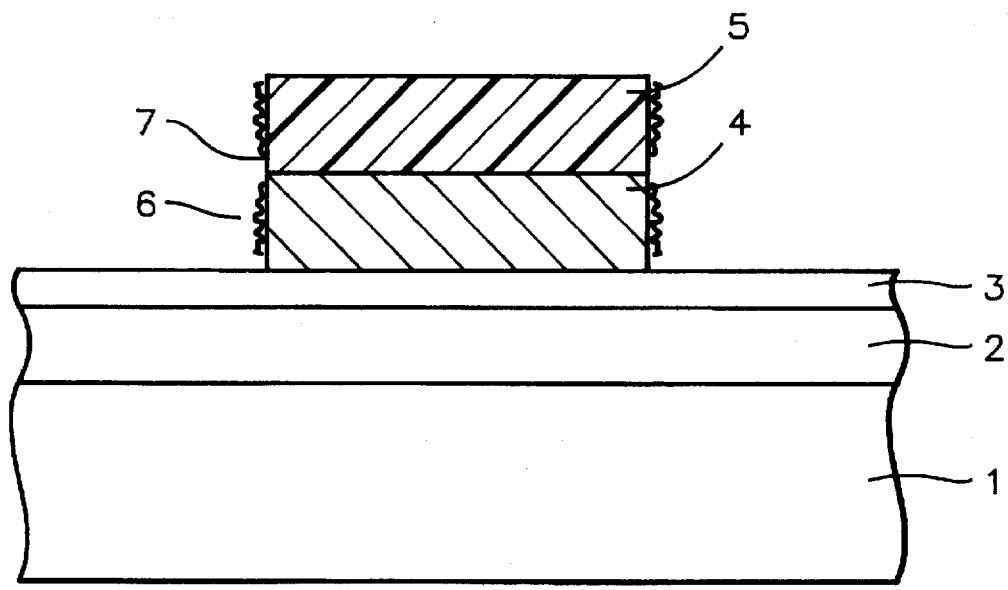
Figure 1D:
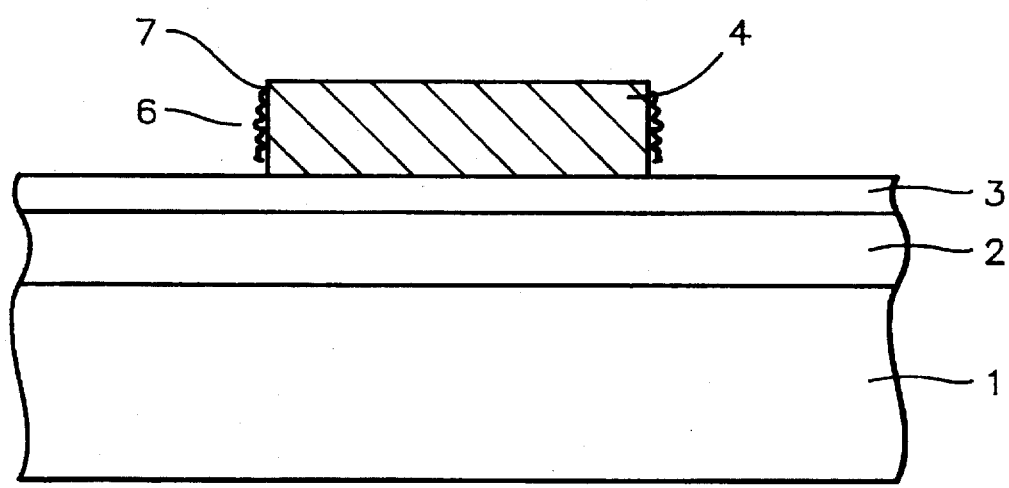

The fabrication of integrated circuits on a semiconductor substrate such as silicon may follow the conventionally practiced procedure, or any specially developed procedure, up to the point of the formation of aluminum interconnects by reactive ion etching. The following is an example of how a simplified integrated circuit is built. Refer now to FIG. 1, in which 1 is the silicon substrate. 2 is a dielectric, which may be a field oxide, which could be a thermally grown $SiO_2$, a chemical vapor deposited (CVD) $SiO_2$, a plasma-enhanced chemical vapor deposited $SiO_2$, or a spin-on silicate glass of a suitable composition. For the reduction of silicon surface states and prevention of build up of interface charge from mobile ions, there may be a thin layer of thermal $SiO_2$, or a CVD silicon nitride-thermal $SiO_2$ composite layer, as indicated by 3, between the silicon substrate and the field oxide in case the field oxide is not a thermal $SiO_2$. For simplicity, not shown in FIG. 1 is part of the structure which contains active device elements such as a transistor emitter, base, and collector in the silicon substrate 1, and the corresponding contact openings in the dielectrics 2 and 3. Under the field dielectric may be some inactive IC elements such as a junction isolation, or a trench isolation; these are understood as such but not shown in FIG. 1. A blanket aluminum, or aluminum-copper alloy, film 4 is then deposited over the entire wafer, as shown in FIG. 1a, by any suitable methods such as sputtering of an aluminum or aluminum-copper alloy target, flash-evaporation of an aluminum or aluminum-copper source by means of resistance heating or electron-gun heating, or by organometallic vapor deposition. A photoresist film 5 is then applied atop the aluminum or aluminum-copper film. The photoresist is then optically exposed through an appropriate mask that defines the pattern of the aluminum lines. The photoresist is then developed into a pattern of openings, such as shown in FIG. 1b. The wafer is then placed in an RIE chamber for the etching of aluminum or aluminum-copper alloy. While the conventional one-step etching method may be used, a preferred etching method consists of two consecutive steps. Gaseous elements containing $Cl_2$ and chlorine-containing compounds such as $BCl_3$ are then fed into the RIE chamber and excited to form a plasma. The preferred process conditions for the two-step etching are as follows: For etch step 1, the etch time is 40 seconds, the gas pressure is 200 mT, the magnetic filed is 30 Gauss, the RF power is 500 watts, with the following gas flow rates: $BCl_3$ at 45 sccm, $Cl_2$ at 30 sccm, $N_2$ at 20 sccm, and $CF_4$ at 5 sccm; for etch step 2, which is basically a clean-up etch, the etch time is determined by end point detection, the gas pressure is 200 mT, no magnetic filed is applied, the RF power is 650 watts, with the following gas flow rates: $BCl_3$ at 45 sccm, $Cl_2$ at 25 sccm, $N_2$ at 15 sccm, and $CF_4$ at 5 sccm; The wafer is held in a chamber with a cathode temperature of 80 degrees centigrade and a wall temperature of 65 degrees centigrade. The gaseous elements are so selected that an etch rate ratio favorable to the removal of aluminum, or the aluminum-copper alloy, relative to the underlying dielectric is achieved, and a complete, clean-cut and uniform etching of the aluminum pattern is obtained without materially affecting the underlying dielectric layer, as shown in FIG. 1c. Some chlorine-containing residues, 6, a product or byproduct of the RIE, will stick to the sidewall 7. According to prior art, the wafer is then rinsed with deionized water. The photoresist is then stripped off, either by using a suitable solvent such as ACT-690 (a commercial product of Asland Chemical Company, a photoresist stripper consisting of a mixture of dimethyl-sulfoxide, monoethanol-amine, an inhibitor, and a surfactant) or by ashing with an oxygen-containing plasma, to give the structure shown in FIG. 1d. After photoresist stripping, the wafer is once again rinsed with deionized water. If ACT solvent is used for the removal of photoresist, it can be repeated once more in order to assure complete removal of the photoresist, and the process will be followed by another rinse of the wafer in deionized water. But usually the chlorine-containing residues 6 still remain on sidewall 7 as shown in FIG. 1d.

According to the preferred embodiment of the present invention, immediately after the reactive ion etching of the aluminum, the process step that produces the example structure shown in FIG. 1c, the wafer is dipped into a weak solution of $NH_4OH$. This solution can be prepared by diluting an aqua $NH_4OH$ solution to the desired concentration. As an example, wafers having integrated circuits which contain aluminum lines to be protected from corrosion are dipped into a 0.5% $NH_4OH$ solution for 15 seconds as soon as the aluminum lines have been reactively ion-etched. The preferred concentration of the $NH_4OH$ is such that the PH value of the solution is about 8. This extra step is then followed by the conventional process procedure of rinsing in deionized water, and the rest of the conventional process steps.

Figure 2:
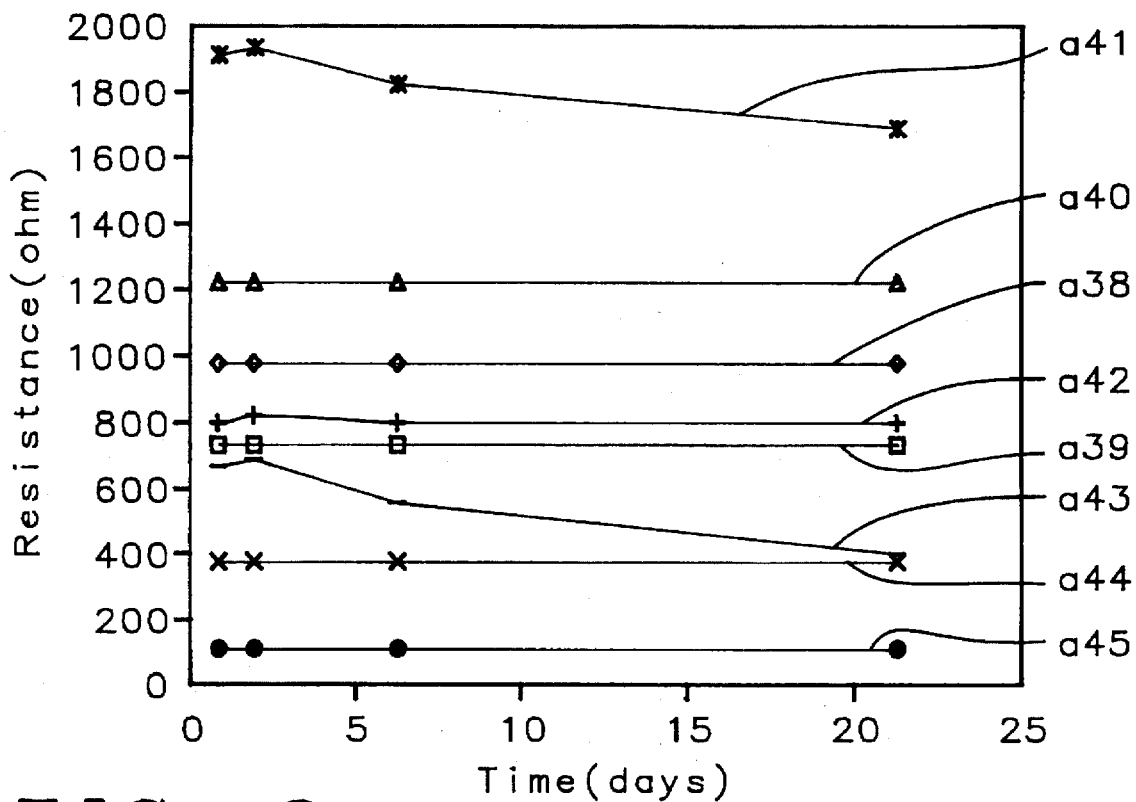
FIG. 2 shows the resistance change over time of a number of test pads in an wafer which has been processed with the present invention.

FIG. 2 shows the resistance measured of aluminum test pads. Test pads A38 and A39 were each measured before and after dipping wafer in $NH_4OH$ solution of preferred specification. The resistance of both test pads went down after the $NH_4OH$ dipping. The remaining test pads, A40 to A45, are all measured at various times after wafer dipping in $NH_4OH$ solution and rinsing with deionized water according to this invention: immediately, 2 days, 6 days, and 21 days. It is seen that the resistance either remained unchanged (test pads A40, A42 and A45), or decreased with time (test pads A41, A43 and A46). While the reason for the decrease of resistance with time is not understood, one thing is clearly evident, that the resistance of none of the aluminum test pads was observed to increase with time, as would be if the aluminum lines were to corrode with time.

Figure 3:
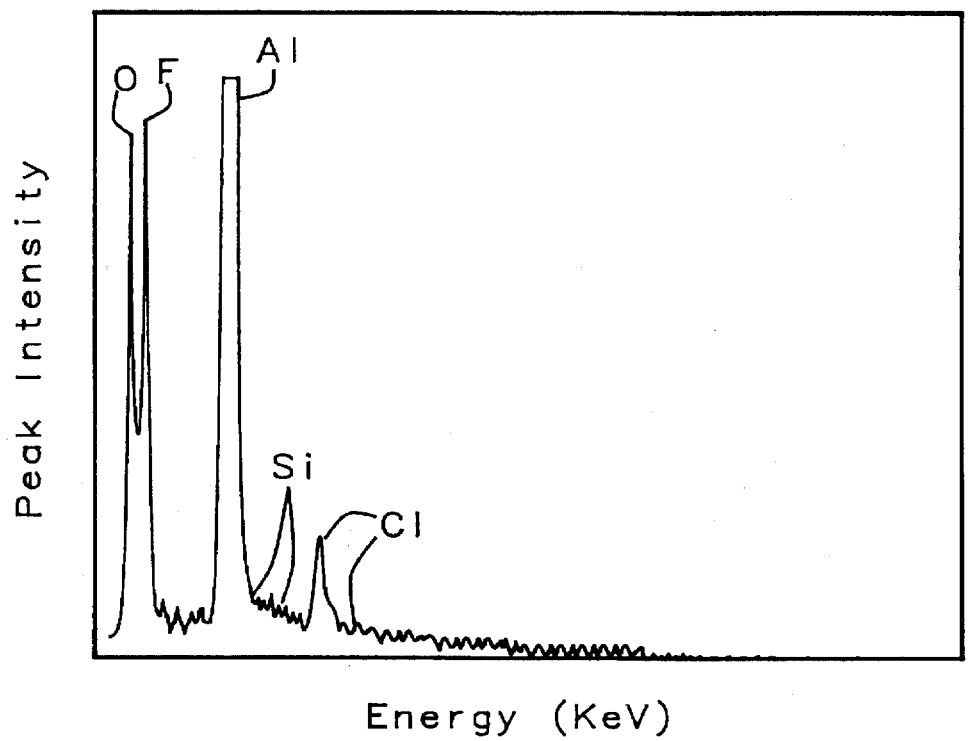
FIG. 3 is EDX (Energy Dispersive X-ray) analysis of various elemental contaminants present at the surface of a wafer which had not been treated with $NH_4OH$ solution.
Figure 4:
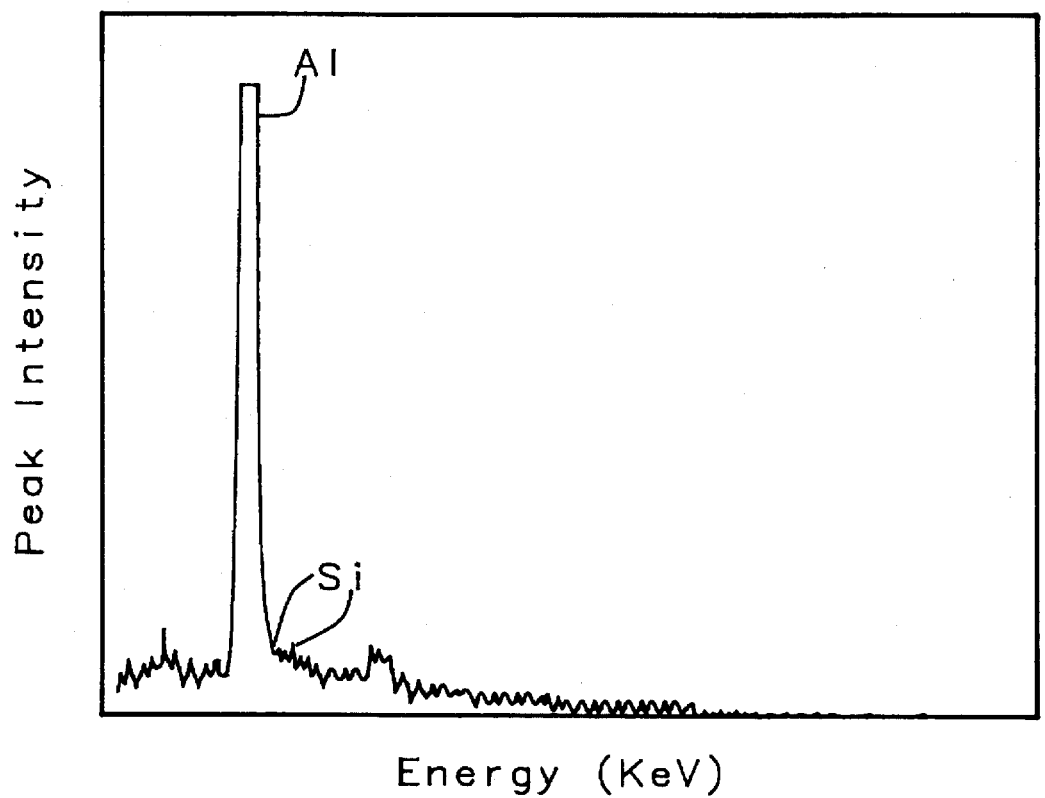
FIG. 4 is EDX analysis of various elemental contaminants present at the surface of a wafer which had been treated with $NH_4OH$ solution.

FIG. 3 shows an EDX (Energy Dispersive X-ray) spectrum of elemental contaminants on the surface of the wafer after reactive ion etching and photoresist stripping, but without dipping in a $NH_4OH$ solution. The EDX analysis is capable of probing an area as small as $2\times2$ $\mu m^2$. It is seen that in addition to the expected Al and Si peaks, there are also Cl peaks in the spectrum, indicating some chlorine-containing residues still remaining on the wafer surface. FIG. 4 shows an EDX spectrum of elements detected on a wafer after dipping in a dilute $NH_4OH$ solution and rinsing with deionized water, as described according to the preferred embodiment of the present invention. Here in this spectrum, no peak corresponding to Cl can be detected. The effectiveness of the method of removing chlorine-containing residue according to this invention is thus proven.

It is easily understood by those skill in the art of fabrication of integrated circuits that other variations of the method of the removal of chlorine-containing residues according to the present invention is possible. In particular, the method can be applied to integrated circuits having multiple levels of aluminum or aluminum-copper alloy interconnection lines, interlayered between multiple layers of dielectrics. In such cases, immediately after each level of aluminum is reactively ion-etched, the wafer is to be dipped in an $NH_4OH$ solution, and rinsed with deionized water.

What is claimed is:

1. A method of preventing corrosion of metal interconnection lines in an integrated circuit structure comprising:

depositing an aluminum-copper alloy layer over a dielectric layer having a pattern of contact holes with a semiconductor substrate, coating a photoresist layer over the aluminum-copper layer exposing the photoresist through appropriate mask having desired pattern of metal lines, developing the photoresist to open up the negative image of the interconnection pattern, reactively etching the aluminum-copper alloy film through the photoresist openings in a plasma containing ions of chlorine and compounds of chlorides, dipping the semiconductor substrate wafer in a solution immediately after the reactive ion etching, and rinsing the wafer with deionized water, and stripping the photoresist either by using a solvent, or by ashing in an oxygen-containing plasma, rinsing with deionized water, rinsing with a solvent, and rinsing with deionized water again.

2. The method of claim 1 wherein said semiconductor substrate is silicon.

3. The method of claim 1 wherein said dielectric layer is thermally grown silicon dioxide.

4. The method of claim 1 wherein said dielectric layer is a composite of a thermally grown silicon dioxide film and a chemically vapor deposited silicon dioxide film.

5. The method of claim 1 wherein said dielectric layer is a composite of a thermally grown silicon dioxide film and a chemically vapor deposited silicon nitride film.

6. The method of claim 1 wherein said aluminum-copper alloy layer is in the form of a film.

7. The method of claim 1 wherein said aluminum-copper alloy is formed by sputtering.

8. The method of claim 1 wherein said aluminum-copper alloy includes a silicon component.

9. The method of claim 1 wherein said aluminum-copper alloy contains no more than 4% of copper.

10. The method of claim 1 wherein the said $NH_4OH$ solution has a pH value of 8 to 11.

11. A method of preventing corrosion of metal wirings in multilevel interconnection in an integrated circuit structure comprising:

depositing a dielectric film over a semiconductor substrate having first-level metal lines formed thereon, coating a photoresist over the dielectric film, exposing the photoresist through an appropriate mask having desired pattern of contact holes through to the first-level metal lines, developing the photoresist to open up via hole pattern in the photoresist, reactively ion-etching the dielectric to open up contact holes in the dielectric layer in a plasma containing Ar (200 sccm±10%), $CF_4$ (20 sccm±10%), $CHF_3$ (20 sccm±10%), $N_2$ (20 sccm±10%), and $SF_6$ (20 sccm±10%), stripping the photoresist either by using a suitable solvent or by ashing in an oxygen containing plasma, depositing a second-level aluminum-copper alloy film over the dielectric layer having a pattern of via holes for connection with the first-level metal lines, coating a photoresist layer over the second-level aluminum-copper film, exposing the photoresist through appropriate mask having desired pattern of metal lines, developing the photoresist to open up the negative image of the interconnection pattern, reactively etching the second-level aluminum-copper film through the photoresist openings in a plasma containing ions of chlorine and compounds of chlorides, dipping the semiconductor substrate wafer in a dilute $NH_4OH$ solution immediately after the reactive ion etching, and rinsing the wafer with deionized water, and stripping the photoresist either by using a solvent or by ashing in an oxygen-containing plasma, rinsing with deionized water, rinsing with a solvent, and rinsing with deionized water again.

12. The method of claim 11 wherein said semiconductor substrate is silicon.

13. The method of claim 11 wherein said dielectric layer is thermally grown silicon dioxide.

14. The method of claim 11 wherein said dielectric layer is a composite of a thermally grown silicon dioxide film and a chemically vapor deposited silicon dioxide film.

15. The method of claim 11 wherein said dielectric layer is a composite of a thermally grown silicon dioxide film and a chemically vapor deposited silicon nitride film.

16. The method of claim 11 wherein said second level dielectric layer is silicon dioxide.

17. The method of claim 11 wherein said second level dielectric layer is formed by sputtering.

18. The method of claim 11 wherein said second level dielectric layer is formed by chemical vapor deposition.

19. The method of claim 11 wherein said second level aluminum-copper alloy layer is in the form of a film.

20. The method of claim 11 wherein said second level aluminum-copper alloy is formed by sputtering.

21. The method of claim 11 wherein said second level aluminum-copper alloy includes a silicon component.

22. The method of claim 11 wherein said second level aluminum-copper alloy contains no more than 4% of copper.

23. The method of claim 11 wherein the said $NH_4OH$ solution has a pH valve of about 8 to 11.

* * * * *